(12) United States Patent
Sato et al.

(10) Patent No.: US 9,114,541 B2
(45) Date of Patent: Aug. 25, 2015

(54) EDGE TOOL

(71) Applicant: JAPAN AVIATION ELECTRONICS INDUSTRY, LIMITED, Tokyo (JP)

(72) Inventors: Akinobu Sato, Tokyo (JP); Akiko Suzuki, Tokyo (JP)

(73) Assignee: JAPAN AVIATION ELECTRONICS INDUSTRY, LIMITED, Tokyo (JP)

( * ) Notice: Subject to any disclaimer, the term of this patent is extended or adjusted under 35 U.S.C. 154(b) by 197 days.

(21) Appl. No.: 14/054,058

(22) Filed: Oct. 15, 2013

(65) Prior Publication Data

US 2014/0202010 A1   Jul. 24, 2014

(30) Foreign Application Priority Data

Jan. 22, 2013  (JP) ................................. 2013-009074

(51) Int. Cl.
*B26B 9/00* (2006.01)
*B26B 9/02* (2006.01)
*C23C 14/48* (2006.01)
(Continued)

(52) U.S. Cl.
CPC ................. *B26B 9/02* (2013.01); *B23B 27/005* (2013.01); *B23C 5/18* (2013.01); *C23C 14/48* (2013.01); *B23B 2200/242* (2013.01); *B23B 2226/125* (2013.01); *B23B 2226/31* (2013.01); *B23B 2226/315* (2013.01); *B23C 2200/243* (2013.01); *B23C 2210/123* (2013.01); *B23C 2226/125* (2013.01); *B23C 2226/31* (2013.01); *B23C 2226/315* (2013.01)

(58) Field of Classification Search
CPC ...... B26B 9/00; B26B 9/02; B23B 2200/242; B23B 2200/243; B23B 27/005; B23B 2226/31; B23B 2226/315; B23C 2210/123; B23C 5/18; B23C 2226/125; B23C 2226/31; B23C 2226/315
USPC ................................................ 30/346.55, 357
See application file for complete search history.

(56) References Cited

U.S. PATENT DOCUMENTS

| 5,814,194 | A | * | 9/1998 | Deguchi et al. ............ 204/192.1 |
| 5,861,210 | A | * | 1/1999 | Lenander et al. .............. 428/336 |
| 6,105,261 | A | * | 8/2000 | Ecer ........................... 30/346.54 |

(Continued)

FOREIGN PATENT DOCUMENTS

| JP | 2004-058168 | 2/2004 |
| JP | 2010-036297 | 2/2010 |

OTHER PUBLICATIONS

Fitting et. al., Mar. 14, 2012.*

(Continued)

*Primary Examiner* — Ned Landrum
*Assistant Examiner* — Richard Crosby, Jr.
(74) *Attorney, Agent, or Firm* — Greenblum & Bernstein, P.L.C.

(57) ABSTRACT

In an edge tool having a cutting edge made of a nonmetal inorganic solid-state material with a facet formed on a ridge of the cutting edge, a pre-wearing layer having a thickness of 5 nm or more and having a surface structure formed by a network of recesses and protuberances surrounded by the recesses is formed on a surface of the facet. The average width of the protuberances is 5 nm to 50 nm. A property value of the pre-wearing layer is different from the property value of the inorganic solid-state material underlying the pre-wearing layer, and there is no solid-solid interface between the pre-wearing layer and the inorganic solid-state material.

12 Claims, 15 Drawing Sheets

(51) Int. Cl.
　　　*B23C 5/18* 　　(2006.01)
　　　*B23B 27/00* 　　(2006.01)

(56) References Cited

U.S. PATENT DOCUMENTS 6,327,784 B1 * 12/2001 Altena et al. ............... 30/346.54
6,402,476 B1 *  6/2002 Bossmann et al. ........ 416/241 R
6,615,496 B1 *  9/2003 Fleming et al. ................ 30/350
2008/0155839 A1 *  7/2008 Anderson ...................... 30/350
2009/0198264 A1 *  8/2009 Svrluga et al. ................ 606/167
2009/0241352 A1 * 10/2009 Sueda et al. .................... 30/350

OTHER PUBLICATIONS

U.S. Appl. No. 13/968,514 to Akiko Suzuki et al., filed Aug. 16, 2013.
Japan Office action, dated Jan. 21, 2014 along with an english translation thereof.

* cited by examiner

FIG. 15

| | NUMBER OF FACETS FORMED | SOLID-SOLID INTERFACE | AVERAGE WIDTH OF PROTUBERANCES OF SURFACE STRUCTURE | MATERIAL PROPERTY VALUE | CHIPPING OF EDGE TOOL | DEFORMATION OF EDGE TOOL | SURFACE TEXTURE OF PROCESSED MATERIAL |
|---|---|---|---|---|---|---|---|
| EXAMPLE 1 | TWO | NOT FORMED | 20 nm | HARDNESS GRADUALLY CHANGES | NOT OCCUR | CHANGE INTO CURVED SURFACE TO ACHIEVE STRESS RELAXATION | MIRROR |
| PRIOR ART EXAMPLE 1 | TWO | NOT FORMED | NOT FORMED | NO PRE-WEARING LAYER | OCCUR | SIGNIFICANT DAMAGE OF ACCUMULATION OF MULTIPLE CHIPPINGS | CLOUDY |
| COMPARATIVE EXAMPLE 1 | TWO | FORMED | 20 nm | HARDNESS SUDDENLY CHANGES AT INTERFACE | OCCUR | SIGNIFICANT DAMAGE OF ACCUMULATION OF MULTIPLE CHIPPINGS | CLOUDY |
| COMPARATIVE EXAMPLE 2 | TWO | NOT FORMED | 100 nm | HARDNESS GRADUALLY CHANGES | OCCUR | SIGNIFICANT DAMAGE OF ACCUMULATION OF MULTIPLE CHIPPINGS | CLOUDY |

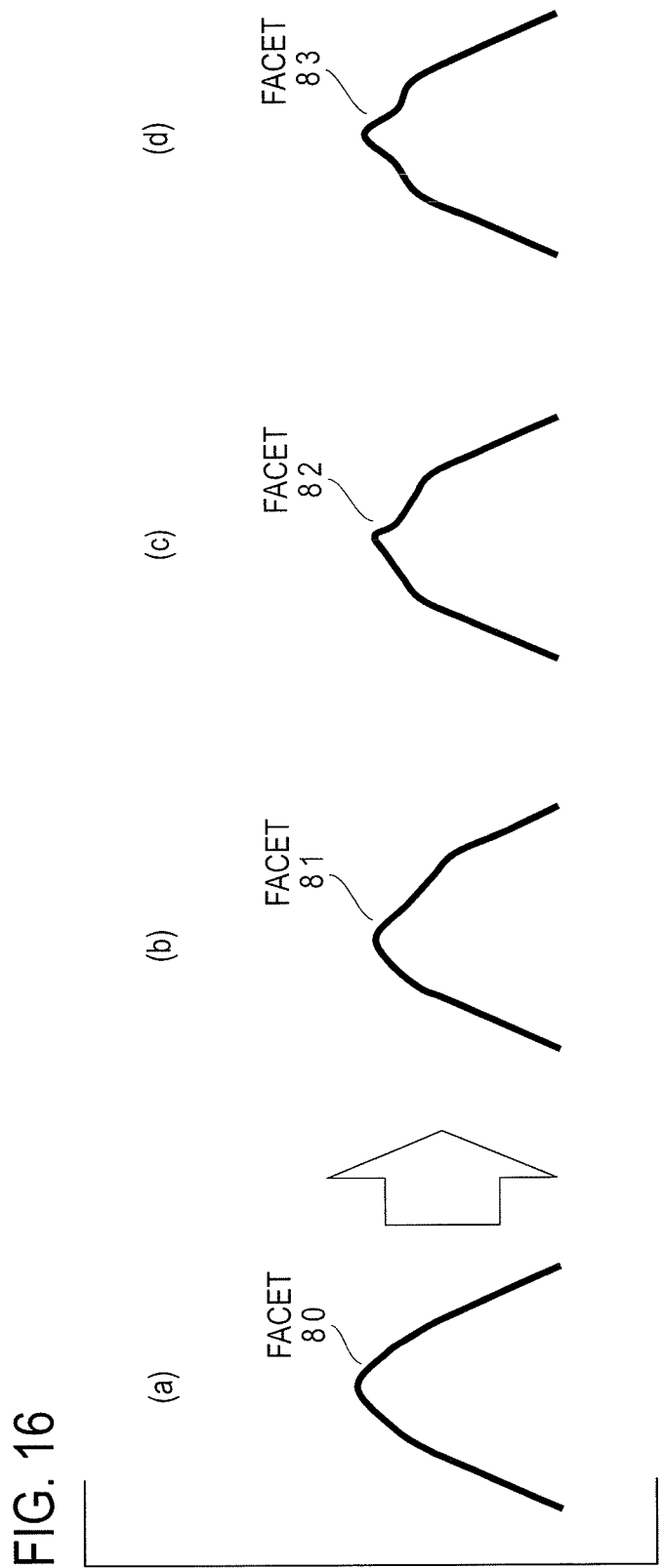

EDGE TOOL

TECHNICAL FIELD

The present invention generally relates to an edge tool. In particular, it relates to an edge tool that has high mechanical durability and can be used for high-precision machining.

BACKGROUND ART

As well known, the performance of the cutting edge formed on the tip end of an edge tool largely depends on into what shape the ridge (tip) of the cutting edge is processed. In the case of a ridge 11 of a cutting edge shown in FIG. 1(a), as the ridge of the cutting edge is sharpened by polishing or the like as shown in FIG. 1(b), the cutting ability improves, but the mechanical durability tends to deteriorate, such as a chipping 12 being more likely to occur on the ridge of the cutting edge during use as shown in FIG. 1(c).

Furthermore, it is also common practice to perform beveling, such as forming a facet or chamfer (collectively referred to as a facet), in order to increase the strength of the ridge of the cutting edge (see Japanese Patent Application Laid-Open No. 2004-58168, for example). FIG. 1(d) shows an example in which a facet 13 is formed on one surface of a ridge 11' of the cutting edge shown in FIG. 1(b), and FIG. 1(e) shows an example in which facets 14 are formed on two surfaces of the ridge 11' of the cutting edge. For example, if the facets 14 are formed on the ridge 11' of the cutting edge as shown in FIG. 1(e), a chipping or other damage is less likely to occur during use as shown in FIG. 1(f).

It is difficult to form, on the ridge of the cutting edge, a facet with the optimal shape, such as a planer surface or a curved surface, or optimal design values, such as an optimal angle and an optimal width. This is because the error of attachment to a processing apparatus, variations of processing apparatuses or the like in actual use of the edge tool are not known in advance. Even if such use conditions are known in advance, it is still not easy to design an optimal facet.

If the facet shape is not optimized, even if a facet is formed on the ridge of the cutting edge, such as a ridge 15 of a cutting edge with a facet 14 formed thereon shown in FIG. 2(a), a crack 16 occurs on the ridge as shown in FIG. 2(b), and a chipping 17 occurs from the crack 16 as shown in FIG. 2(c). Such chippings occur one after another, leading to a significant problem that the ridge of the cutting edge changes shape as shown in FIG. 2(d), degrades functionality as the edge tool and becomes unusable. Note that the optimal values of the shape of the facet are expected to depend on the kind of the material to be processed and the processing conditions.

SUMMARY OF THE INVENTION

In view of such circumstances, an object of the present invention is to provide an edge tool that has high mechanical durability and can be used for high-precision machining even if the width, angle, curvature radius or the like of a facet is not optimized.

According to a first invention, there is provided an edge tool having a cutting edge made of a nonmetal inorganic solid-state material with a facet formed on a ridge of the cutting edge, in which a pre-wearing layer having a thickness of 5 nm or more and having a surface structure formed by a network of recesses and protuberances surrounded by the recesses is formed on a surface of the facet, an average width of the protuberances is 5 nm to 50 nm, and a property value of the pre-wearing layer is different from the property value of the inorganic solid-state material underlying the pre-wearing layer, and there is no solid-solid interface between the pre-wearing layer and the inorganic solid-state material.

According to a second invention, there is provided an edge tool having a cutting edge made of a nonmetal inorganic solid-state material with a facet formed on a ridge of the cutting edge, in which a pre-wearing layer having a thickness of 5 nm or more and having a surface structure formed by a network of recesses and protuberances surrounded by the recesses is formed on a surface of the facet, an average width of the protuberances is 5 nm to 50 nm, and the Young's modulus of the pre-wearing layer is smaller than the Young's modulus of the inorganic solid-state material underlying the pre-wearing layer, and there is no solid-solid interface between the pre-wearing layer and the inorganic solid-state material.

According to a third invention, there is provided an edge tool having a cutting edge made of a nonmetal inorganic solid-state material with a facet formed on a ridge of the cutting edge, in which a pre-wearing layer having a thickness of 5 nm or more and having a surface structure formed by a network of recesses and protuberances surrounded by the recesses is formed on a surface of the facet, an average width of the protuberances is 5 nm to 50 nm, and the density of the pre-wearing layer is lower than the density of the inorganic solid-state material underlying the pre-wearing layer, and there is no solid-solid interface between the pre-wearing layer and the inorganic solid-state material.

According to a fourth invention, there is provided an edge tool having a cutting edge made of a nonmetal inorganic solid-state material with a facet formed on a ridge of the cutting edge, in which a pre-wearing layer having a thickness of 5 nm or more and having a surface structure formed by a network of recesses and protuberances surrounded by the recesses is formed on a surface of the facet, an average width of the protuberances is 5 nm to 50 nm, and the hardness of the pre-wearing layer is lower than the hardness of the inorganic solid-state material underlying the pre-wearing layer, and there is no solid-solid interface between the pre-wearing layer and the inorganic solid-state material.

According to a fifth invention, there is provided an edge tool having a cutting edge made of a nonmetal inorganic solid-state material with a facet formed on a ridge of the cutting edge, in which a pre-wearing layer having a thickness of 5 nm or more and having a surface structure formed by a network of recesses and protuberances surrounded by the recesses is formed on a surface of the facet, an average width of the protuberances is 5 nm to 50 nm, and the pre-wearing layer has an amorphous structure, the inorganic solid-state material underlying the pre-wearing layer has a crystalline structure, and a boundary region between the inorganic solid-state material and the pre-wearing layer has a structure that gradually changes from the crystalline structure to the amorphous structure as it goes from the inorganic solid-state material to the pre-wearing layer.

According to a sixth invention, there is provided an edge tool having a cutting edge made of a nonmetal inorganic solid-state material with a facet formed on a ridge of the cutting edge, in which a pre-wearing layer is formed on a surface of the facet, the pre-wearing layer having a thickness of 5 nm or more, being more susceptible to wear than the inorganic solid-state material and allowing a part of the ridge of the cutting edge in which stress is concentrated during use of the ridge of the cutting edge to quickly wear so as to optimize the shape of the facet, and a property value of the pre-wearing layer is different from the property value of the inorganic solid-state material underlying the pre-wearing layer, and there is no solid-solid interface between the pre-wearing layer and the inorganic solid-state material.

According to a seventh invention, in any of the first to sixth inventions, the pre-wearing layer is formed by irradiation with a gas cluster ion beam.

Effects of the Invention

According to the present invention, an edge tool that has high mechanical durability and can be used for high-precision machining is provided.

BRIEF DESCRIPTION OF THE DRAWINGS

FIG. 1 are diagrams for illustrating an effect of a facet formed on a ridge of a cutting edge, in which FIG. 1(a) shows the ridge of the cutting edge, FIG. 1(b) shows a sharpened ridge of the cutting edge, FIG. 1(c) shows a chipped edge, FIG. 1(d) shows a ridge of a cutting edge with a facet formed on one surface thereof, FIG. 1(e) shows a ridge of a cutting edge with facets formed on two surfaces thereof, and FIG. 1(f) shows a ridge of a cutting edge that is less likely to chip during use;

FIG. 2 are diagrams for illustrating occurrence of a chipping in the case where the facet is not optimized, in which FIG. 2(a) shows a ridge of a cutting edge with a facet formed thereon, FIG. 2(b) shows the ridge of the cutting edge in which a crack occurs, FIG. 2(c) shows the ridge of the cutting edge in which a chipping occurs, and FIG. 2(d) shows the ridge of the cutting edge that has degraded functionality;

FIG. 8 are diagrams showing an example of the shape of an edge tool, in which FIG. 8(a) shows an example of the shape of the edge tool before facets are formed thereon, and FIG. 8(b) shows an example of the shape of the edge tool after facets are formed thereon;

FIG. 9 are diagrams showing examples of shapes of edge tools, in which FIG. 9(a) shows a linear cutting edge, FIG. 9(b) shows a disk cutting edge, and FIG. 9(c) shows a rotary endmill cutting edge;

FIG. 13 are diagrams showing examples in which a facet has a curved surface, in which FIG. 13(a) shows a ridge of a cutting edge without a facet, FIG. 13(b) shows an example in which the whole of a facet has a curved surface, FIG. 13(c) shows an example in which a facet is formed by two planar sections and a curved section that connects the planar sections to each other, and FIG. 13(d) shows an example in which a facet is formed by three curved sections, and the curved sections are slightly recessed surfaces;

FIG. 15 is a table showing results of the cutting processing test; and

FIG. 16 are diagrams showing shapes of facets after use of the edge tool according to the present invention, in which FIG. 16(a) shows the shape of a facet before use of the edge tool, FIG. 16(b) shows the shape of a facet after cutting processing of cemented carbide, FIG. 16(c) shows the shape of a facet after cutting processing of copper, and FIG. 16(d) shows the shape of a facet after cutting processing of aluminum.

DETAILED DESCRIPTION

First, circumstances leading to the present invention and important points of the present invention will be described.

In a typical process, a facet is formed on a ridge of a cutting edge by first forming a sharp edge and then removing a part of the edge. With an edge tool made of a hard material, whose hardness is an advantage, the facet is made of the same hard material as the base material of the edge tool. In some cases, the ridge of the cutting edge is coated to improve durability. In such cases, the ridge is coated with a material having higher wear resistance than the base material. In many cases, the material having higher wear resistance has at least one of the following properties: high hardness, high Young's modulus, high density and the like.

As described above, it has been conventionally believed that improving the wear resistance of the ridge of the cutting edge is essential to improve the mechanical durability of the ridge of the cutting edge.

The present invention, however, aims at improving the mechanical durability of the ridge of the cutting edge by forming a pre-wearing layer, which is susceptible to wear, on a facet formed on the ridge of the cutting edge. The present invention provides a technique that takes an essentially different approach from the conventional technique to improve the wear resistance of the ridge of the cutting edge itself.

Next, why the pre-wearing layer formed on the facet improves the mechanical durability of the ridge of the cutting edge will be described.

With the ridge of a cutting edge on which no facet is formed, a stress concentration occurs at a micro crack or the like on the ridge to cause damage to the ridge. With the ridge of a cutting edge on which a facet is formed, the stress concentration caused by any micro crack is relaxed, so that damage to the ridge is less likely to occur. Wear damage to the ridge of the cutting edge occurs at such a point of stress concentration as the point of stress concentration drops off. Once the point of stress concentration has dropped off, the stress concentration is relaxed, and any part no longer drops off. That is, the part no longer wears. With the ridge of the cutting edge on which a facet is formed, as the wear progresses, the ridge of the cutting edge may be blunted or sharpened. The shape of the ridge of the cutting edge after wearing, which is often generally blunted but partially sharpened, depends on the way of stress concentration and therefore can hardly be generally expected. However, if the wear progresses so as to relax the stress concentration, the stress concentration is less likely to occur, so that the wear progresses very slowly whether the ridge of the cutting edge is sharpened or blunted.

Figure 1:
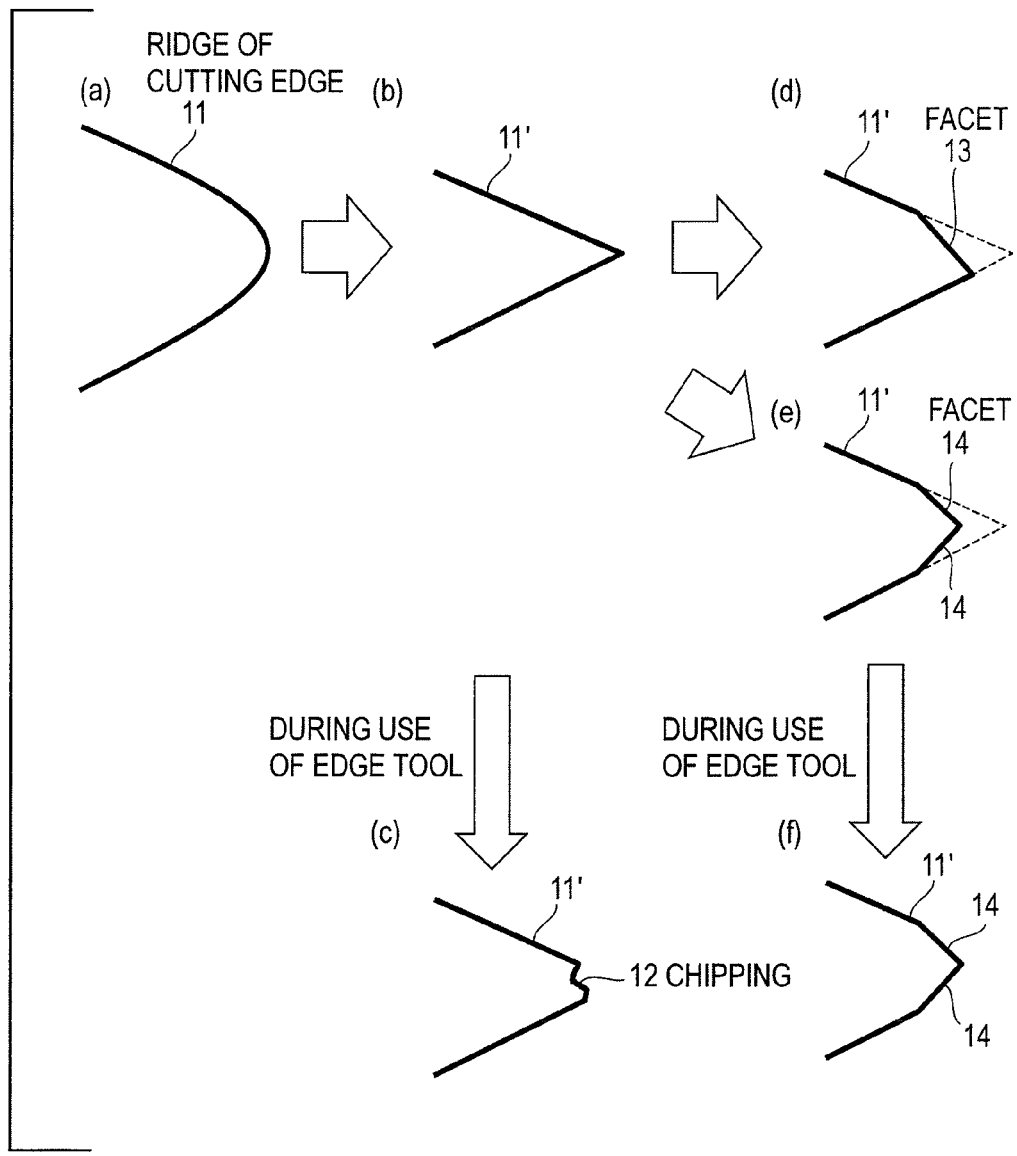
Figure 2:
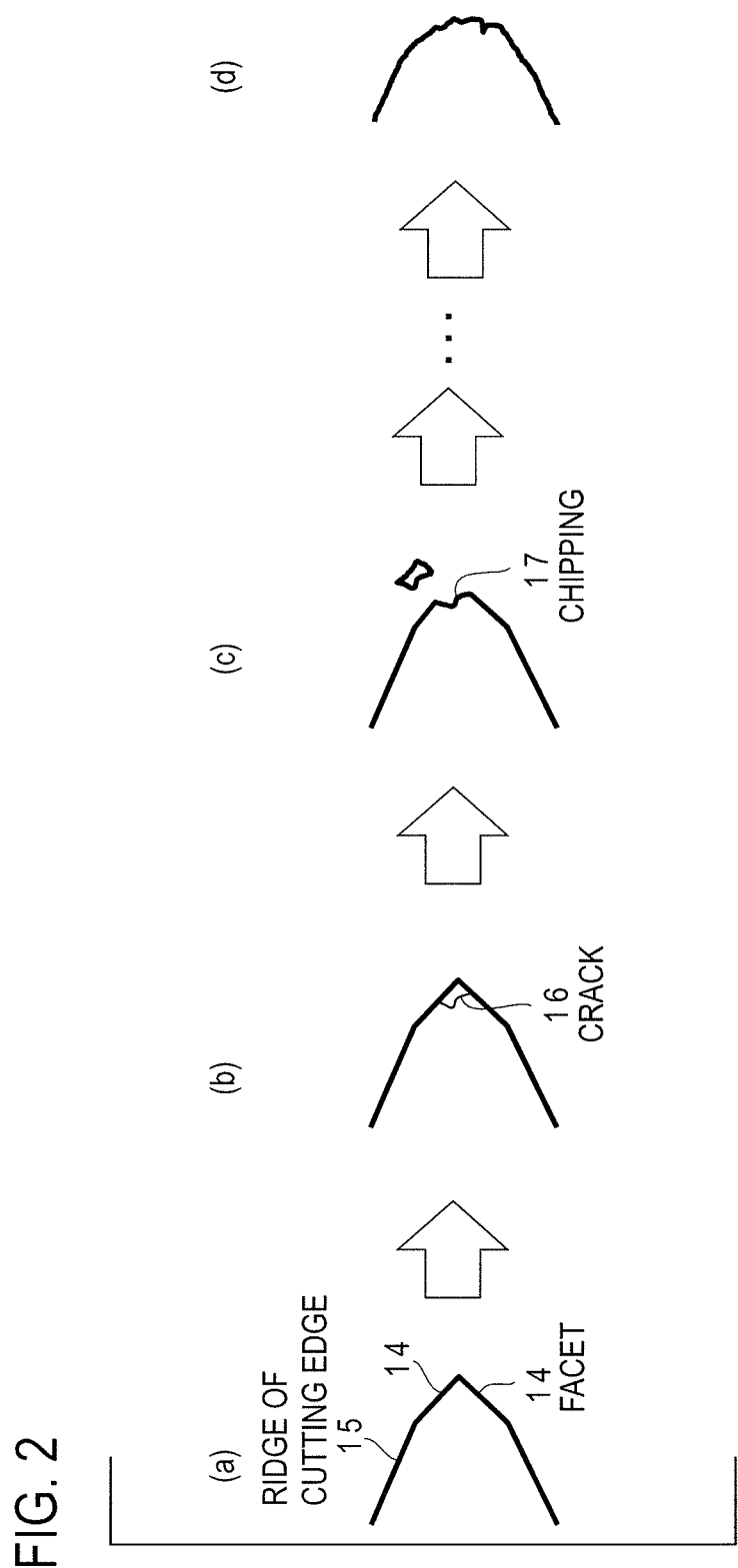
Figure 3:
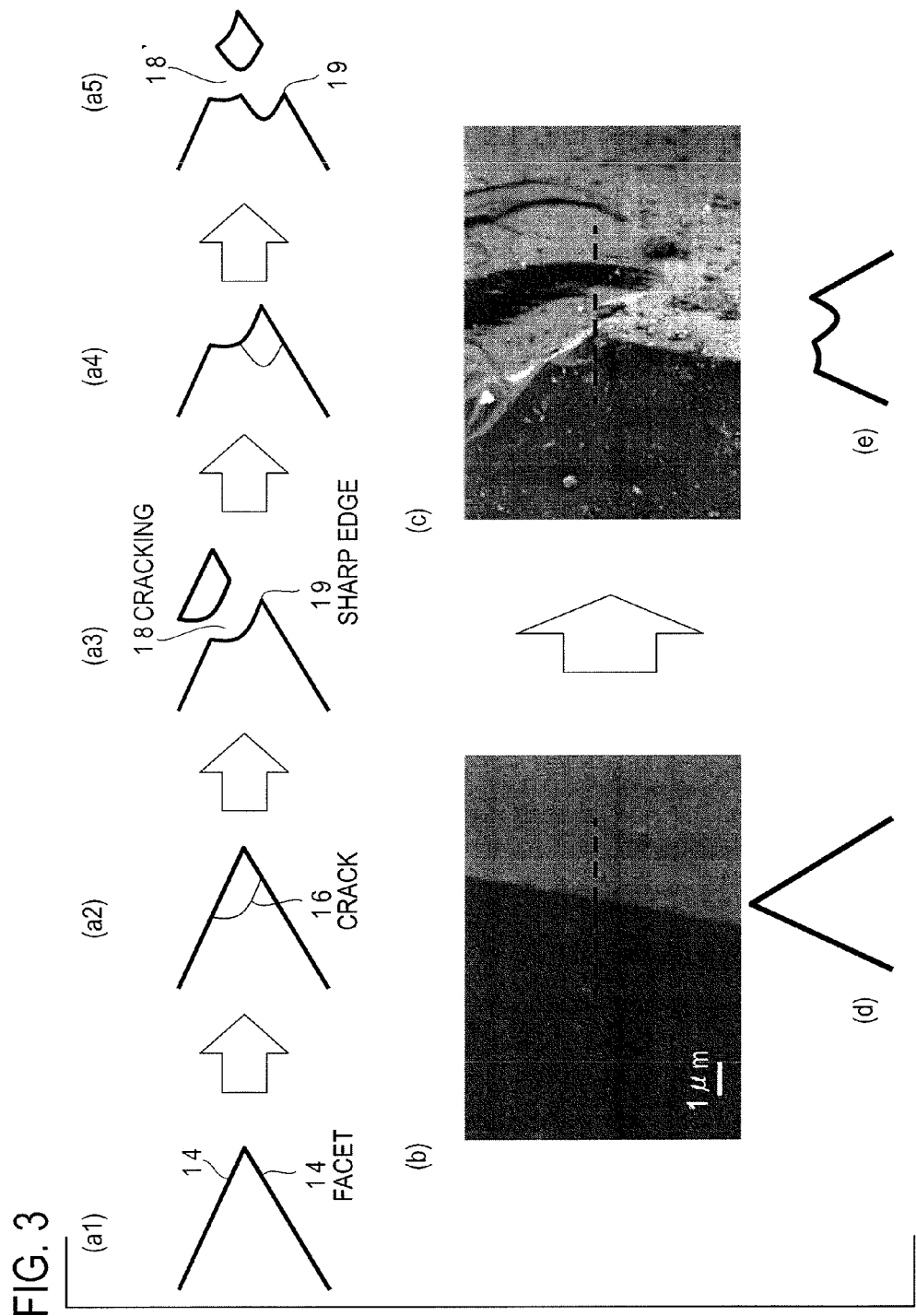
FIG. 3 are diagrams (FIGS. 3(a1) to 3(a5)), pictures (FIGS. 3(b) and 3(c)) and schematic diagrams (FIGS. 3(d) and 3(e)) for illustrating a mode in which parts of a ridge of a cutting edge drop off as a result of cracking or chipping.

Next, how wear damage occurs on the ridge of the cutting edge will be discussed in detail. FIGS. 3(a1) to 3(a5) show an example of a mode in which damage, such as a cracking or chipping, occurs on the ridge of the cutting edge. A crack 16 occurs in a facet 14 (see FIG. 3(a1)) formed on the ridge of the cutting edge as shown in FIG. 3(a2), and a cracking starts from the crack 16 as shown in FIG. 3(a3). Such a cracking 18 or chipping often forms another sharp edge 19. The sharp edge 19 formed as a result of the cracking 18 is susceptible to stress concentration and induces a further cracking 18' or chipping as shown in FIGS. 3(a4) and 3(a5). In this way, as the damage to the facet 14 on the ridge of the cutting edge progresses, the stress concentration is not relaxed, so that the damage continues to progress, and the service life of the edge tool expires soon. Note that the pictures of FIGS. 3(b) and 3(c) show the facet 14 in the states shown in FIGS. 3(a1) and 3(a5), respectively, observed from above (from the tip end thereof), and FIGS. 3(d) and 3(e) are schematic diagrams showing the cross-sectional shapes of the facet taken along the dashed lines in FIGS. 3(b) and 3(c), respectively.

Figure 4:
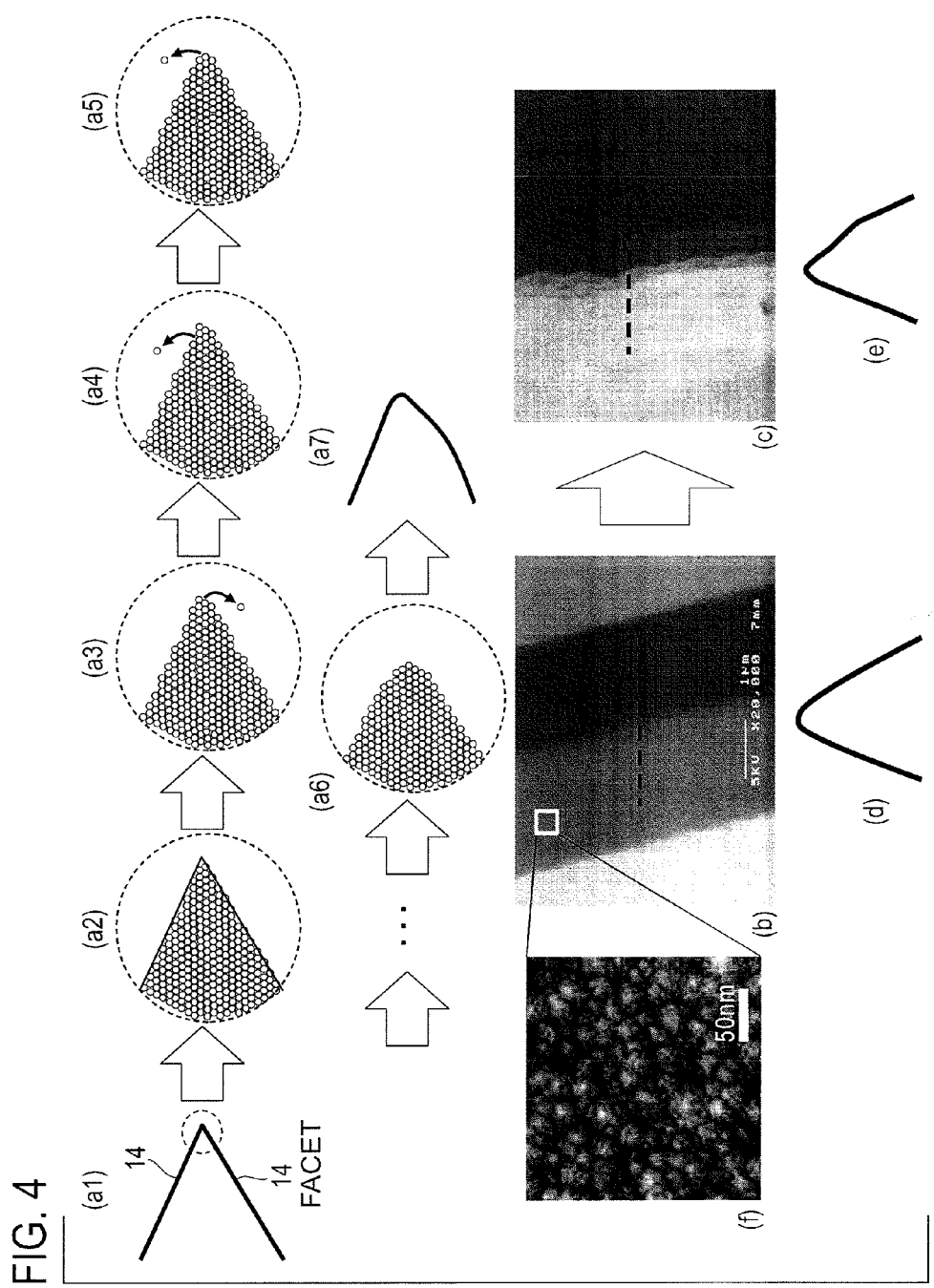
FIG. 4 are diagrams (FIGS. 4(a1) to 4(a7)), pictures (FIGS. 4(b), (c) and (f)) and schematic diagrams (FIGS. 4(d) and 4(e)) for illustrating a mode in which parts of a ridge of a cutting edge successively desorb on a nanometer scale.

On the other hand, FIGS. 4(a1) to 4(a7) show an example of a successive wear mode in which damage such as a cracking or chipping does not occur on the edge of the cutting edge, but the ridge of the cutting edge gradually wears. In this mode, atoms in the surface layer of the ridge of the cutting edge successively desorb on a nanometer scale. FIGS. 4(a2) to 4(a6) show how parts experiencing the highest stress successively desorb as a part having a size of a single atom to approximately several tens of nanometers when a force is exerted on the facet 14 (see FIG. 4(a1)) on the ridge of the cutting edge. If the desorption on the nanometer scale occurs, the involved part has a smooth shape and therefore is less likely to experience stress concentration and wear. As the edge tool is continuously used, a similar desorption on the nanometer scale occurs at another site. The shape of the ridge of the cutting edge changes as the desorption repeatedly occurs. In an actual example, two facets were formed on the ridge of the cutting edge of an edge tool, and the tip end of the ridge had a radius curvature of approximately 0.5 μm. Then, as the edge tool was used, the symmetry of the facets disappeared, the ridge of the cutting edge became sharper than the initial shape, and the radius of curvature decreased to approximately 0.1 μm. No cracking or chipping was observed on the ridge of the cutting edge.

As described above, the initial facet shape shown in FIG. 4(a1) changes to the stable shape in which stress concentration relaxation is more likely to occur shown in FIG. 4(a7). Thus, during use of the edge tool, the facet shape suitable for the use conditions is spontaneously formed. Note that the pictures of FIGS. 4(b) and 4(c) show the facet 14 in the states shown in FIGS. 4(a1) and 4(a7), respectively, observed from above, and FIGS. 4(d) and 4(e) are schematic diagrams showing the cross-sectional shapes of the facet taken along the dashed lines in FIGS. 4(b) and 4(c), respectively. The picture of FIG. 4(f) is an enlarged picture of a part of FIG. 4(b) (a part in the square in FIG. 4(b)).

As described above, to improve the mechanical durability of the ridge of the cutting edge, it is an essential requirement that the successive wear described above with reference to FIG. 4 is induced while preventing occurrence of the damage mode in which a cracking or chipping occurs described above with reference to FIG. 3. The inventors have found for the first time that forming a pre-wearing layer, which is susceptible to wear, is a key to prevent a cracking or chipping of the edge tool from the early phase of the use of the edge tool and induce the successive wear mode. In addition, as a result of earnest investigation, the inventors have found that the following two conditions are essential to allow spontaneous formation of the facet shape suitable for the use conditions:

(a) there is no solid-solid interface between the pre-wearing layer and the base material; and (b) a surface of the pre-wearing layer has a surface structure in which a network of recesses and protuberances surrounded by the recesses are formed.

Figure 5:
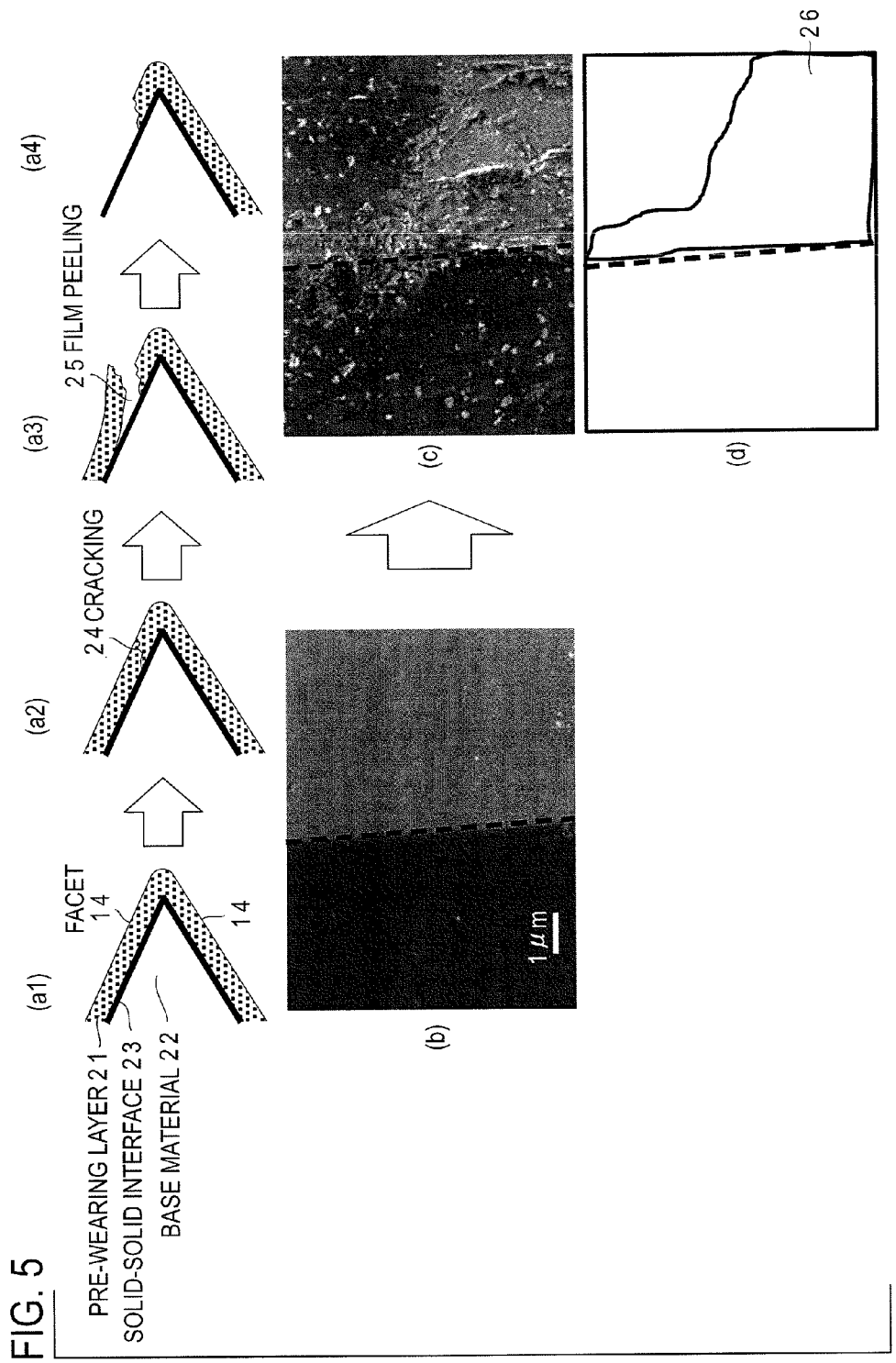
FIG. 5 are diagrams (FIGS. 5(a1) to 5(a4)), pictures (FIGS. 5(b) and 5(c)) and a schematic diagram (FIG. 5(d)) for illustrating peeling of a pre-wearing layer in the case where there is a solid-solid interface between the pre-wearing layer and a base material.

FIGS. 5(a1) to 5(a4) show a case where the facet 14 of the ridge of the cutting edge does not meet the condition (a) described above, and there is a solid-solid interface 23 between a pre-wearing layer 21 and a base material 22. A typical process that results in formation of the solid-solid interface 23 is a deposition process for the pre-wearing layer 21, such as vapor deposition. As shown in FIGS. 5(a2) to 5(a4), once the solid-solid interface 23 is formed between the pre-wearing layer 21 and the base material 22, peeling of the pre-wearing layer 21 or other significant damage occurs because stress is concentrated on the solid-solid interface 23 so that a cracking 24 easily widens and a film peeling 25 easily occurs. As a result, the successive wear of the pre-wearing layer 21 does not occur, and the spontaneous formation of the facet shape suitable for relaxation of the stress concentration does not occur. The pictures of FIGS. 5(b) and 5(c) show the facet 14 with the pre-wearing layer 21 deposited on the surface thereof and the facet 14 from which the pre-wearing layer 21 has peeled, respectively, both observed from above the facet 14. FIG. 5(d) is a sketch of FIG. 5(c). In FIG. 5(d), reference numeral 26 denotes a part from which the pre-wearing layer 21 has peeled. At the site of the film peeling, another sharp edge or the like, on which stress is to be concentrated, is formed. Thus, if there is the solid-solid interface 23 between the pre-wearing layer 21 and the base material 22, the shape of the ridge of the cutting edge that has high durability is not spontaneously formed.

Figure 6:
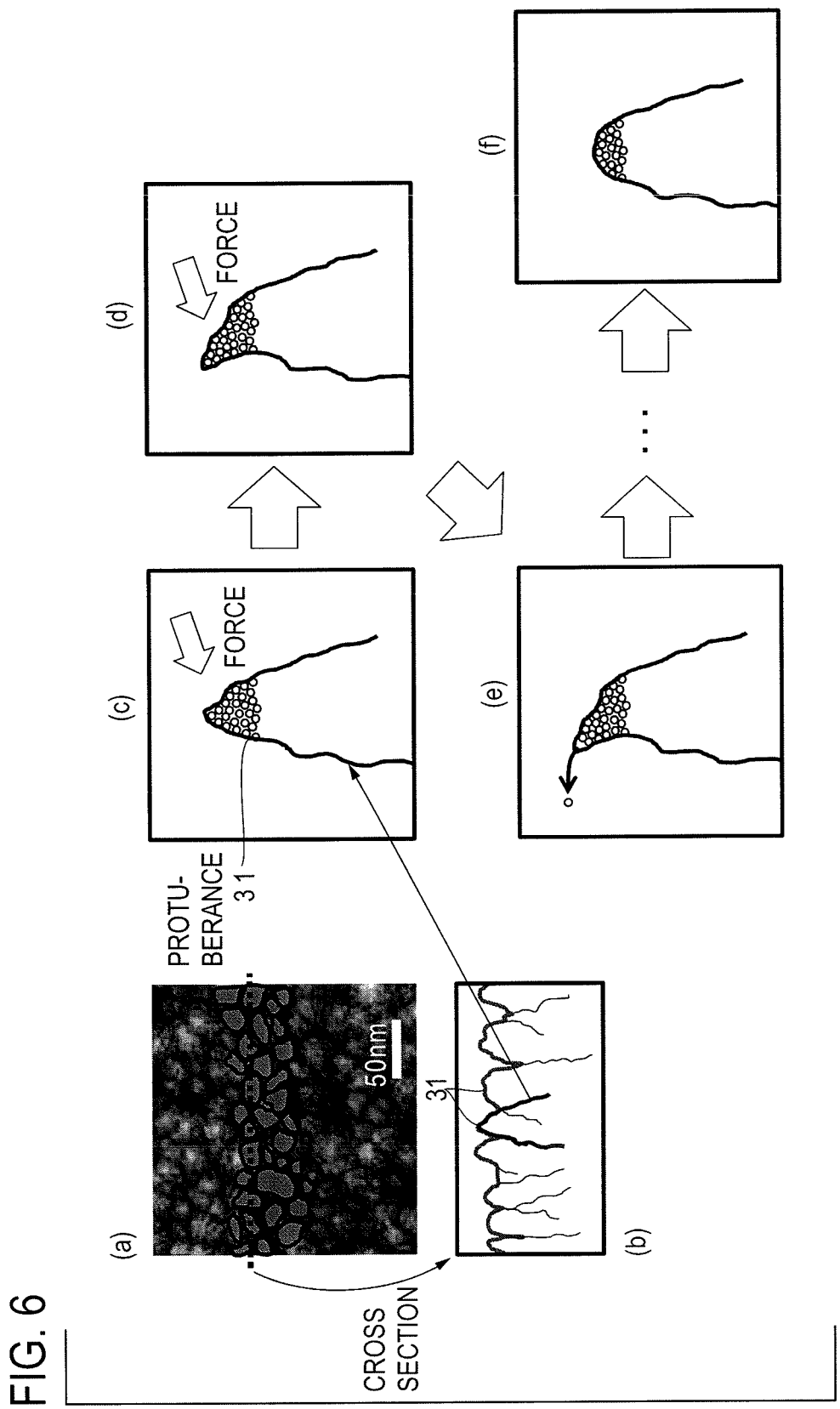
FIG. 6 are diagrams (FIGS. 6(b), 6(c), 6(d), 6(e) and 6(f)) and a picture (FIG. 6(a)) for illustrating a structure of the pre-wearing layer and a mechanism of wear according to the present invention.

Next, the other condition (b) required for the facet shape suitable for the use conditions to be spontaneously formed during use of the edge tool will be discussed. FIG. 6(a) shows a scanning electron microscopic (SEM) image of the surface structure of the pre-wearing layer. As can be seen from this drawing, protuberances having a width of approximately several tens of nanometers are formed on the surface. A schematic diagram of the protuberances is superimposed on the SEM image. As for the cross section of the protuberances 31, as shown in the schematic diagram of FIG. 6(b), there is no solid-solid interface between the pre-wearing layer and the base material. Furthermore, the protuberances 31 have at least one of the following properties: a hardness lower than that of the base material, a Young's modulus lower than that of the base material, a density lower than that of the base material, and the like. There is no solid-solid interface, and the material properties change. It means that there is at least a region that continuously and gradually change in material properties between the pre-wearing layer and the base material.

FIGS. 6(c) to 6(f) are schematic diagrams for illustrating a change of the protuberance 31 when a force is exerted thereto. If a force is exerted to the tip end of the protuberance, the tip end of the protuberance is elastically or plastically deformed to relax the stress concentration as shown in FIG. 6(d), because the protuberance has a lower hardness than the base material, for example. As the force still continues to be exerted, a part of the tip end of the protuberance gradually desorbs on the nanometer scale as shown in FIG. 6(e). What desorbs from the tip end of the protuberance is only the part to which the highest force is exerted, so that the tip end of the protuberance is deformed to relax the stress concentration. As such a process repeatedly occurs, the appearance of the tip end of the protuberance typically changes to a rounded shape as shown in FIG. 6(f).

Figure 7:
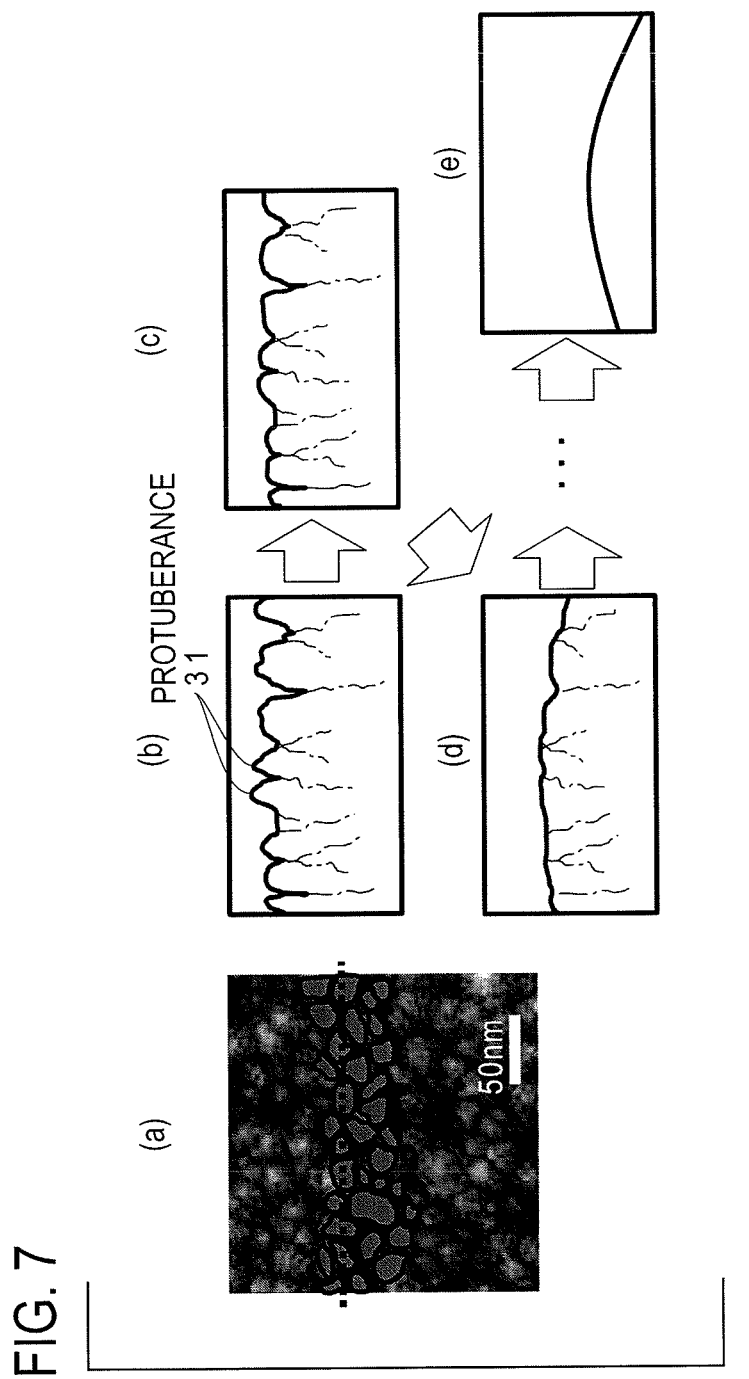
FIG. 7 are diagrams (FIGS. 7(b), 7(c), 7(d) and 7(e)) and a picture (FIG. 7(a)) showing the structure of the pre-wearing layer and a way in which wear progresses according to the present invention.

FIG. 7(a) shows the same picture as that of FIG. 6(a), and FIGS. 7(b) to 7(e) are diagrams for illustrating how the protuberances 31 are deformed as described above and then further wear. As the edge tool continues to be used, the protuberances, that is, the pre-wearing layer itself, wear to disappear as shown in FIG. 7(e), and the base material is exposed at the site to which the highest force is exerted. In this process, the wear neatly progresses in accordance with the distribution of the stress in the ridge of the cutting edge, so that the ridge of the cutting edge comes to have a smooth shape, no crack occurs, and no cracking or chipping occurs. In this way, the facet shape suitable for the use conditions of the edge tool is spontaneously formed during use of the edge tool. In addition, the pre-wearing layer on the surface where the high force is exerted disappears, and the edge tool shows the wear resistance of the material thereof.

In the following, an embodiment of the present invention will be described.

An edge tool 40 according to this embodiment is a block-shaped material having a cutting edge 41 formed thereon and typically has a rake face 42 and flanks 43 as shown in FIG. 8(a), for example. An edge tool 40' shown in FIG. 8(b) is the edge tool 40 having facets 44 formed thereon. The edge tool can have any shape that has a cutting edge formed thereon, such as a linear cutting edge 51, a disk cutting edge 52 and a rotary endmill cutting edge 53 shown in FIGS. 9(a) to 9(c), respectively.

The material can be any hard nonmetal inorganic solid-state material but typically is single-crystalline diamond, binderless cBN (cubic boron nitride), or ceramics, such as a polycrystalline diamond sintered body, a cBN sintered body, a tungsten carbide sintered body (referred to also as a cemented carbide), an alumina sintered body or a zirconia sintered body. Alternatively, a brittle material, such as single-crystalline silicon or glass, can also be used as the material for the edge tool. The term "nonmetal inorganic solid-state material" used in the present invention means "a material containing a hard inorganic solid-state material" and does not exclude the possibility that the material contains a metal as the inorganic solid-state material. This is because a cutting edge primarily made of a nonmetal inorganic solid-state material has the effects and advantages of the present invention. For example, tungsten carbide sintered body contains tungsten carbide particles, which are a hard nonmetal inorganic solid-state material, and a metal, such as cobalt, which serves to couple the tungsten carbide particles to each other, but the tungsten carbide particles primarily serve the function of the cutting edge.

A process of forming the cutting edge involves forming the outer shape of the edge tool by laser beam processing, wire discharge processing or the like and then polishing the resulting cutting edge. In the case of a hard material, such as single-crystalline diamond or binderless cBN, a process referred to as scaife polishing is often used.

In a typical example, a block having a length of 2 mm and a height of 1 mm and a width of 1 mm is cut from a binderless cBN material by laser processing. The block is then shaped by grinding the surfaces with a diamond grindstone, and the cutting edge is polished and finished with a scaife grinding machine. The angle of the cutting edge is 65 degrees, and the curvature radius of the tip end of the ridge of the cutting edge is approximately 50 nm.

A facet is formed on the ridge of the cutting edge. As a process of forming the facet, a process of polishing and chamfering the cutting edge with a scaife grinding machine impregnated with diamond paste can be used. Another process of irradiating the ridge of the cutting edge with a gas cluster ion beam (GCIB) can also be used. Typically, the latter process can be conducted under conditions that argon is used as a raw material gas, the acceleration voltage is 20 kV, and the irradiation dose is $3 \times 10^{18}$ ions/cm$^2$. The raw material gas is not particularly limited as far as the gas can form a gas cluster. The acceleration voltage and the irradiation dose can be changed within the range of design variation.

Figure 10:
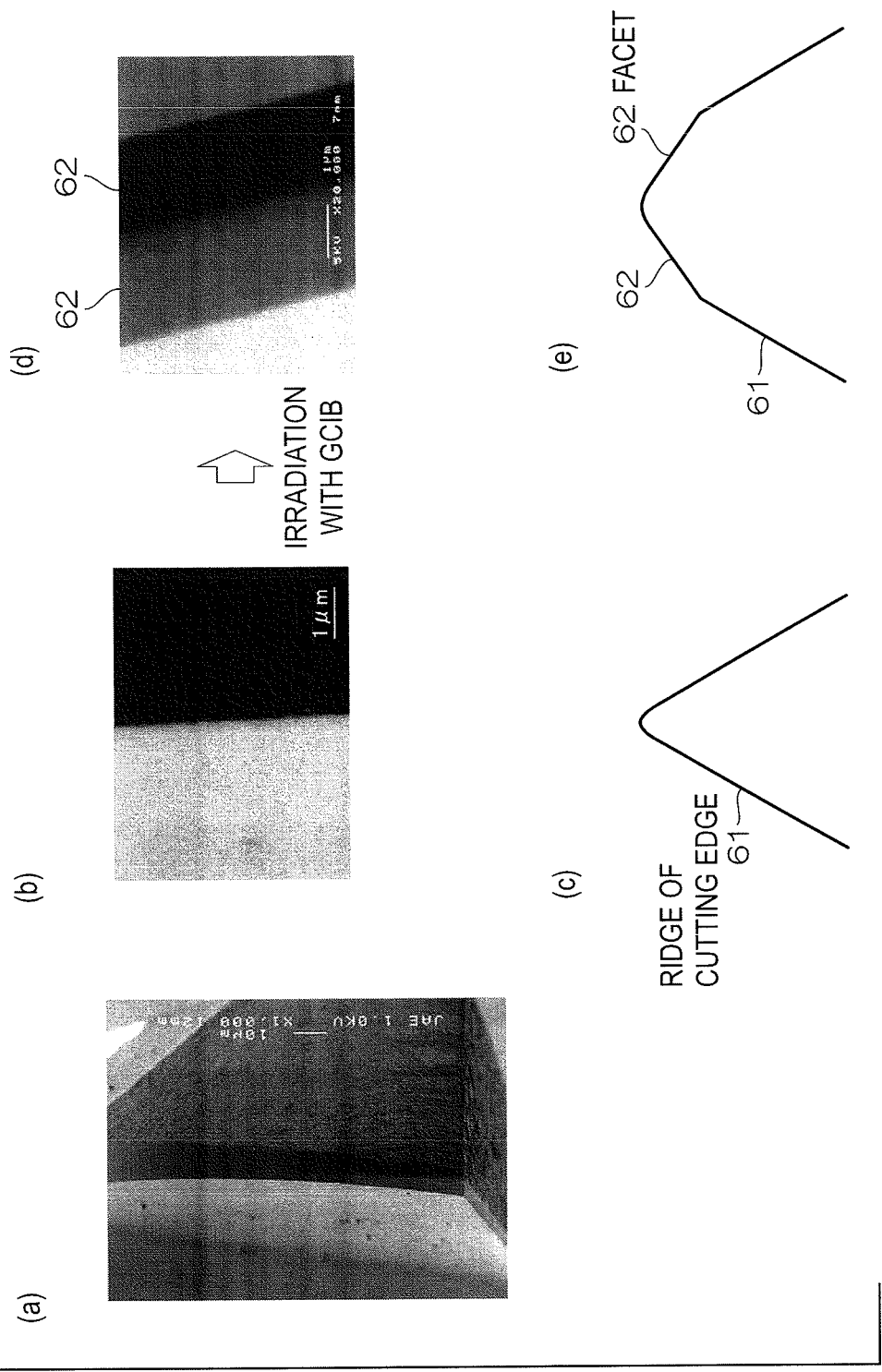
FIG. 10 are pictures (FIGS. 10(a), 10(b) and 10(d)) and diagrams (FIG. 10(c) and FIG. 10(e)) showing states of the ridge of the cutting edge before and after irradiation with a gas cluster ion beam.
Figure 11:
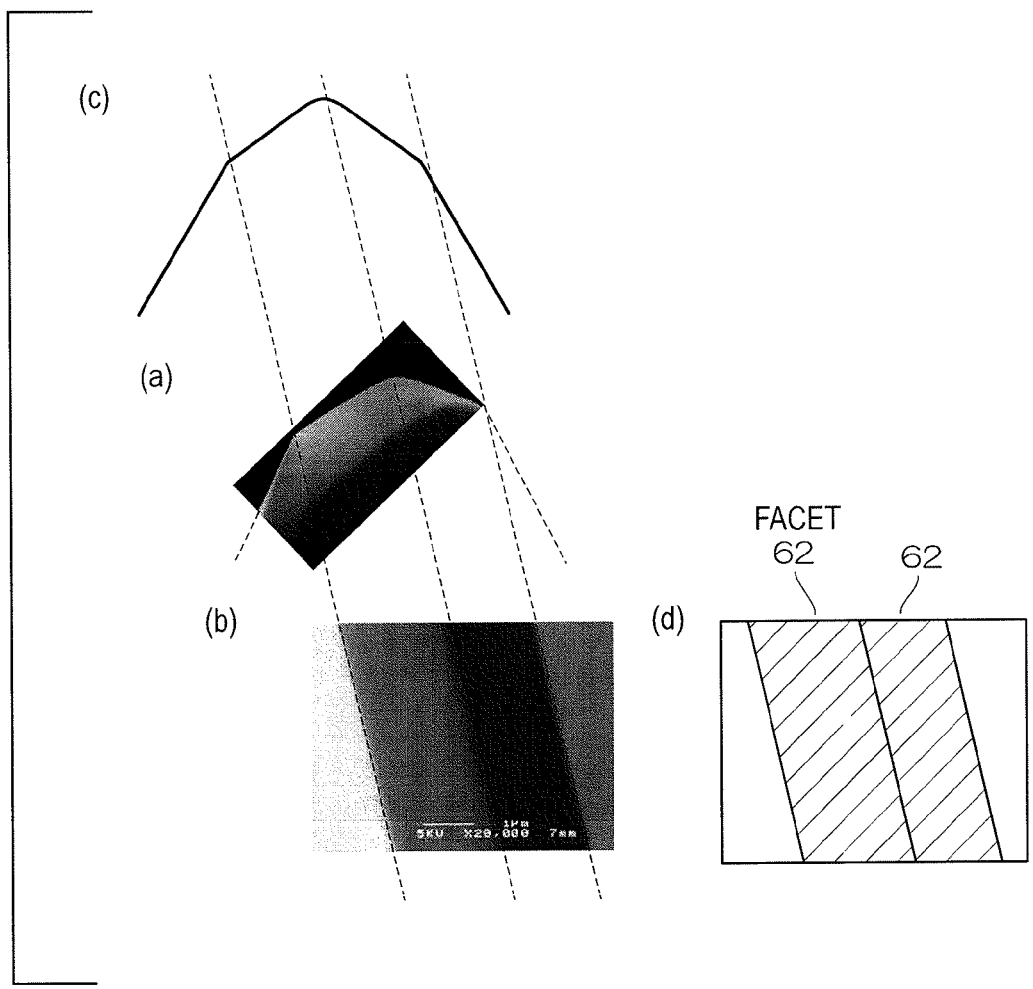
FIG. 11 are pictures (FIGS. 11(a) and 11(b)) and diagrams (FIG. 11(c) and FIG. 11(d)) showing a state of the ridge of the cutting edge after irradiation with the gas cluster ion beam.
Figure 12:
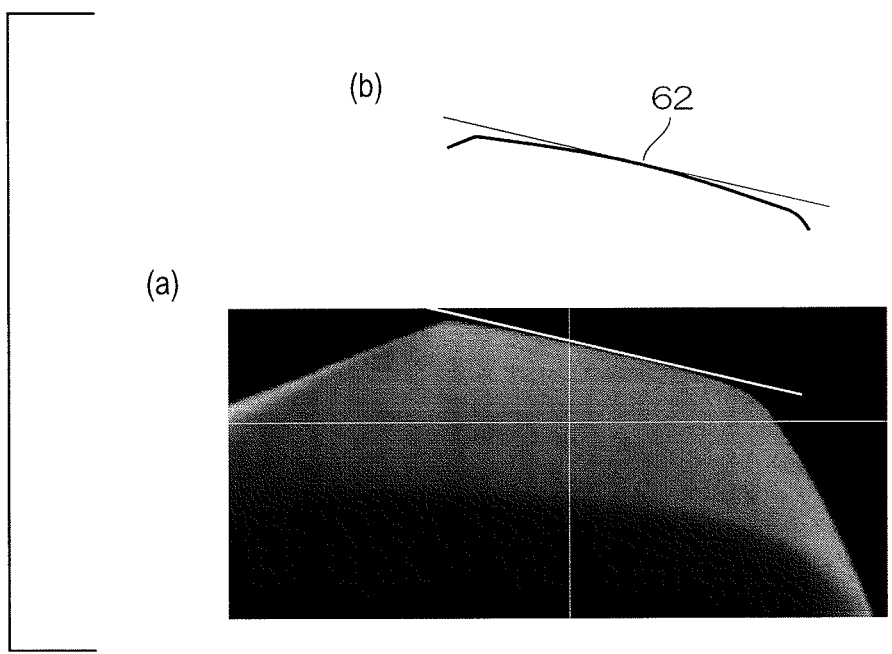
FIG. 12 are a picture (FIG. 12(a)) and a diagram (FIG. 12(b)) showing a state of the ridge of the cutting edge after irradiation with the gas cluster ion beam.

The picture of FIG. 10(a) is an SEM image of a ridge 61 of a cutting edge yet to be irradiated with a gas cluster ion beam observed from above, and the picture of FIG. 10(b) is an enlarged image of FIG. 10(a). The picture of FIG. 10(d) shows the state of the ridge 61 of the cutting edge irradiated with the gas cluster ion beam. Note that FIGS. 10(c) and 10(e) are side views showing the shapes of the ridge 61 of the cutting edge shown in FIGS. 10(b) and 10(d), respectively. As can be seen from the picture of FIG. 10(d), two facets 62 are formed on the ridge 61 of the cutting edge. FIG. 11 show pictures and a sketch showing the state of the ridge 61 of the cutting edge irradiated with the gas cluster ion beam, as with FIGS. 10(d) and 10(e), and FIG. 12(a) is an enlarged image of the picture of FIG. 11(a). FIG. 12(b) is a sketch of a part (a facet) of the picture of FIG. 12(a). As can be seen form FIGS. 12(a) and 12(b), the facet partially has a curved surface.

A plurality of facets does not need to be formed on the ridge of the cutting edge, but at least one facet is needed. The facet may have a planar surface, a curved surface or a combination thereof. If the facet surface is curved, the facet seamlessly connects to the ridge of the cutting edge, thereby relaxing the stress concentration on the ridge of the cutting edge and improving the mechanical durability.

Figure 13:
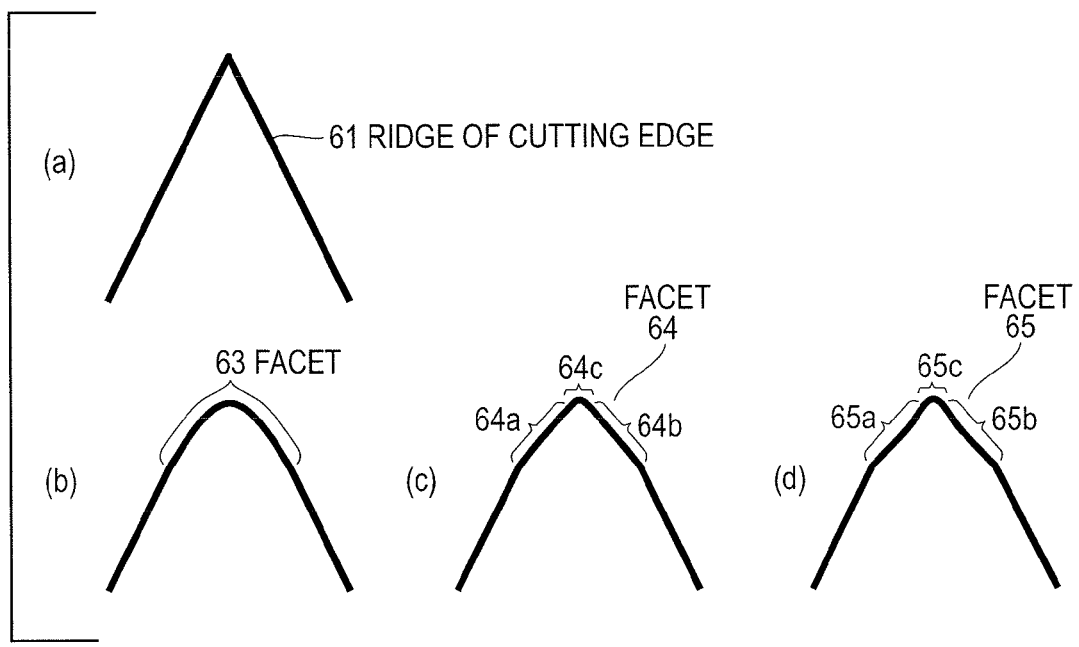

FIG. 13 show an example of a curved facet. FIG. 13(a) shows the ridge 61 of the cutting edge without a facet for comparison, and FIGS. 13(b) to 13(d) show examples of various types of curved facets. In FIG. 13(b), the whole of a facet 63 has a curved surface. In FIG. 13(c), a facet 64 is formed by two planar sections 64a and 64b and a curved section 64c that connects the planar sections 64a and 64b to each other. In FIG. 13(d), a facet 65 is formed by three curved sections 65a to 65c, and the curved sections 65a and 65b are slightly recessed surfaces, as shown in the drawing. The facet forming process based on irradiation with the gas cluster ion beam described above is substantially characterized in that the facet can be easily shaped to have a smooth three-dimensionally curved surface as shown in FIG. 13.

Next, a pre-wearing layer is formed on the surface of the facet on the ridge of the cutting edge. The process of forming the pre-wearing layer must not produce any solid-solid interface between the base material and the pre-wearing layer. For example, a process of chemical vapor deposition (CVD) of diamond-like carbon cannot be used because the process produces a solid-solid interface. This is because the pre-wearing layer starts peeling off at the solid-solid interface as described above. In addition, the part from which the pre-wearing layer has peeled has a sharp protrusion or edge, on which stress is likely to be concentrated, and promotes chipping or cracking of the ridge of the cutting edge.

As a result of earnest investigation, the inventors have found that the pre-wearing layer can be formed without producing any solid-solid interface by irradiating the material surface with a gas cluster ion beam. According to the prior art, it has been found that irradiation of a material surface with a gas cluster ion beam flattens the material surface, thereby making the material surface less susceptible to wear. However, the inventors have found for the first time that if a certain type of protuberance structure is formed by irradiation with a gas cluster ion beam, the material surface is more susceptible to wear. Any distinct solid-solid interface is prevented from being produced by changing the initial arrangement structure of the substances forming the material surface while forming a protuberance structure. And a gas cluster ion beam that achieves this requirement is chosen for irradiation. For example, the irradiation energy needs to be greater than the interatomic bond energy. More specifically, each atom forming the gas cluster needs to have an energy of several eV or higher. In a typical example, in order to produce a gas cluster formed by 1000 atoms each having an energy of 5 eV or higher, the irradiation energy needs to be 5 keV (5 kV in terms of acceleration voltage) or higher. In other respects, such as the kind of the raw material gas, there is no particular limitation.

However, not forming any solid-solid interface as described above is not enough, but the pre-wearing layer should have a surface structure formed by a network of recesses and protuberances surrounded by the recessed. The average width of the protuberances is 5 to 50 nm, and a property value of the pre-wearing layer is different from that of the inorganic solid-state material underlying the pre-wearing layer described above. The average width of the protuberances needs to be equal to or greater than 5 nm, because if the average width is too small, the structure change of the protuberances is completed before the stress concentration is relaxed by the deformation thereof, and the protuberances cannot serve their function. On the other hand, the average width needs to be equal to or smaller than 50 nm, because if the average width of the protuberances is too large, the stress concentration can hardly be relaxed, and substantially the same stress concentration as that in the structure without the protuberances occurs.

As a process of forming such a pre-wearing layer, a process of irradiating the facet surface with a gas cluster ion beam can be used as described above. This process can be conducted at the same time with formation of the facet. As a property value of the pre-wearing layer and the inorganic solid-state material, a property value relating to the mechanical durability can be selected, such as Young's modulus, density or hardness. Furthermore, the property value relating to the mechanical durability may be degree of amorphousness (degree of crystallinity) or percentage of voids, for example. That is, any property value on which the wear speed of the pre-wearing layer depends can be used.

In the case where Young's modulus is chosen as the property value, the Young's modules of the pre-wearing layer is smaller than the Young's modulus of the inorganic solid-state material underlying the pre-wearing layer. In the case where density or hardness is chosen as the property value, the density or hardness of the pre-wearing layer is lower than the density or hardness of the inorganic solid-state material underlying the pre-wearing layer. In the case where degree of amorphousness (degree of crystallinity) is chose as the property value, for example, it is supposed that the pre-wearing layer has an amorphous structure, and the inorganic solid-state material underlying the pre-wearing layer has a crystalline structure. In this case, a boundary region between the inorganic solid-state material and the pre-wearing layer has a structure that gradually changes from the crystalline structure to the amorphous structure as it goes from the inorganic solid-state material to the pre-wearing layer. The degree of amorphousness of the pre-wearing layer is greater than the degree of amorphousness of the inorganic solid-state material underlying the pre-wearing layer.

Although it is enough that the pre-wearing layer formed by irradiation with the gas cluster ion beam is formed only the facet surface, any particular measure is not needed to prevent the pre-wearing from being formed on the rake face or flank. The pre-wearing layer can also be formed on the whole of the cutting edge by irradiating the rake face and the flank as well as the facet surface with the gas cluster ion beam. The facet on which the pre-wearing layer is formed can have any shape, including width and length thereof, that is in conformity with examples of conventional edge tools. In order for the protuberances to act effectively, the thickness of the pre-wearing layer needs to be equal to or greater than the average width of the protuberances, specifically, equal to or greater than 5 nm. It will be obvious that the process of forming the pre-wearing layer is not limited to the irradiation with the gas cluster ion beam, and any process that produces the structure described above can be used.

The edge tool according to this embodiment having the structure described above has the pre-wearing layer formed on the facet on the ridge of the cutting edge. During use of the edge tool, the pre-wearing layer gradually wears from a part where high stress occurs, and the facet shape that avoids stress concentration spontaneously develops. According to an edge tool different form the present invention, successive wear does not progress, and a chipping or cracking develops from a part on which stress is concentrated, such as a micro crack or a solid-solid interface. As the edge tool according to the present invention wears to some extent, the material of the edge tool itself, which has high wear resistance, is exposed, and wear can hardly further progress. In this way, the edge tool according to the present invention has improved mechanical durability under a wide range of cutting conditions even if the width, the length, the curvature radius or the like of the facet formed on the ridge of the cutting edge is not optimized. Thus, the present invention provides an edge tool having high mechanical durability and high productivity.

In the following, results of a cutting processing test will be shown with regard to an example 1 of the present invention, a prior art example 1 and comparative examples 1 and 2.

Example 1

An edge tool having a pre-wearing layer formed over the entire surface of the ridge of the cutting edge including the facets (the thickness of the pre-wearing layer was 100 nm).

Prior Art Example 1

The same edge tool as in the example 1 except that the pre-wearing layer was not formed.

Comparative Example 1

An edge tool having a preliminarily wearing layer of diamond-like carbon deposited by CVD on the entire surface of the ridge of the cutting edge including the facets and having a solid-solid interface.

Comparative Example 2

The same edge tool as in the example 1 except that the average width of the protuberances of the pre-wearing layer was greater than 50 nm.

Figure 8:
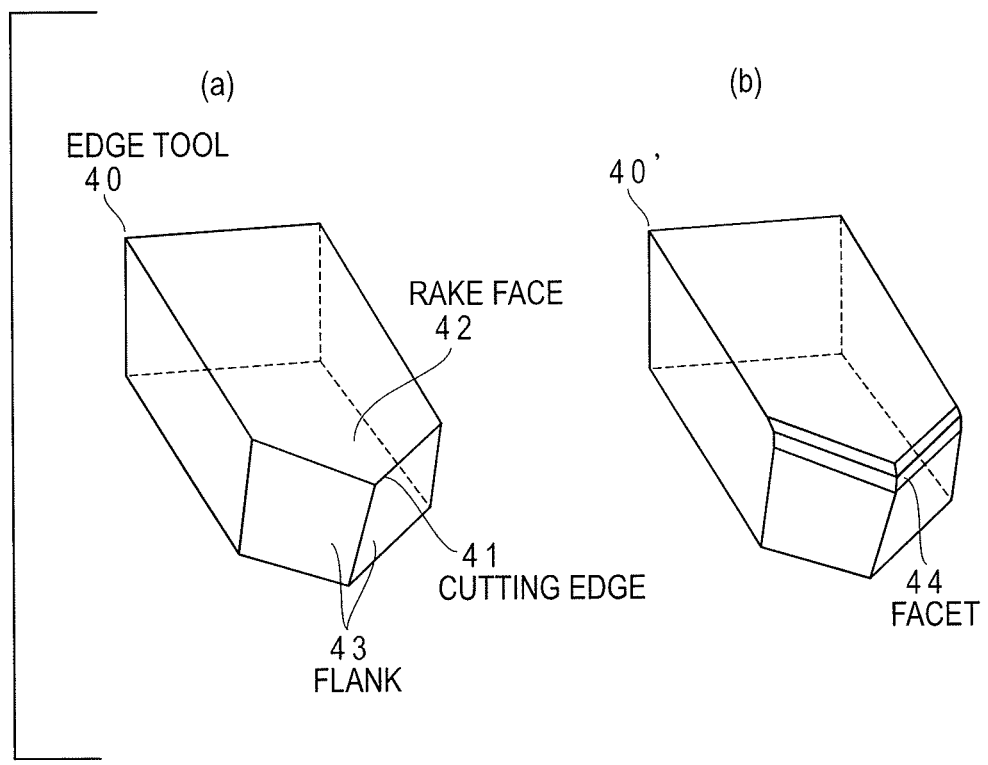
Figure 9:
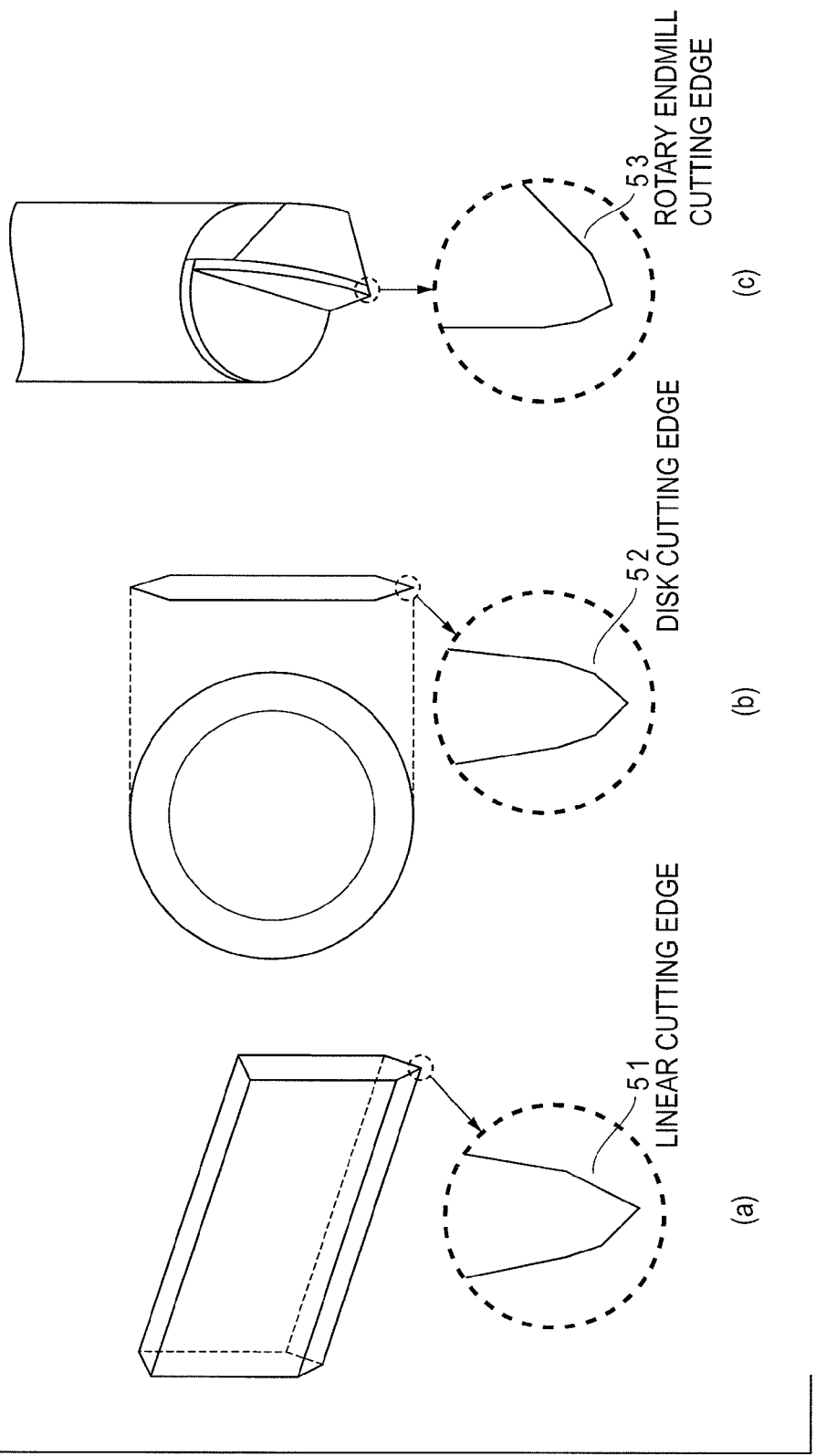
Figure 14:
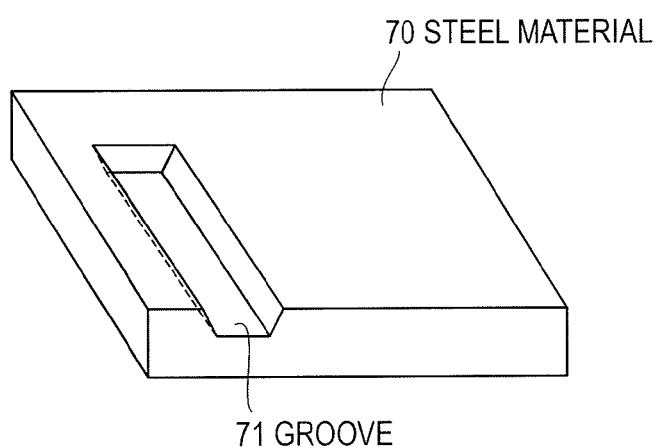
FIG. 14 is a diagram showing the shape of a groove formed in a cutting processing test.

The edge tools had the shape shown in FIG. 8(*b*) and was made of binderless cBN. Cutting processing was conducted with planning machines incorporating these edge tools. 50 grooves 71 having a width of 300 μm, a depth of 100 μm and a length of 5 mm shown in FIG. 14 were formed in a steel material (Japanese Industrial Standards SKD11) 70, and chippings on the ridges of the cutting edges of the edge tools were observed with a scanning electron microscope (SEM), and the texture of the surface of the steel material was observed with an optical microscope. The results are shown in the table of FIG. 15.

As shown in the table, in the prior art example 1 and the comparative examples 1 and 2, chippings occurred on the ridge of the cutting edge and accumulated to lead to significant damage. As a result, the surface texture of the steel material was rough and cloudy. In the example 1, in contrast with the prior art example 1 and the comparative examples 1 and 2, the pre-wearing layer formed on the surface of the facets on the ridge of the cutting edge gradually wore, and the facet shape changed to relax the stress concentration. As a result, occurrence of a chipping on the ridge of the cutting edge was prevented, the surface of the steel material was a mirror surface, and the steel material was processed with high precision.

Using the same edge tool as that in the example 1, the material to be processed was changed to cemented carbide, copper, aluminum and the like, the cutting speed was changed, and the precision of attachment of the edge tool was changed. Then, similar results were obtained. FIG. 16 shows an example of how the pre-wearing layer wore to relax the stress concentration and the ridge of the cutting edge was deformed as the edge tool was used. FIG. 16(*a*) shows the shape of a facet 80 before the edge tool was used, and FIGS. 16(*b*) to 16(*d*) show the shapes of facets 81, 82 and 83 after cutting cemented carbide, copper and aluminum, respectively.

As shown in FIG. 16, the edge tool was deformed in various ways before and after use of the edge tool, such as a planar facet changing into a curved facet, two facets further having finer chamfered faces, two facets merging into one facet, or a facet angle being changed. This means that the edge tool in the example has improved mechanical durability (increased strength of the ridge of the cutting edge) under a wide range of cutting conditions even if the width, the length, the curvature radius or the like of the facet formed on the ridge of the cutting edge is not optimized, and the present invention can provide an edge tool having high mechanical durability and high productivity.

What is claimed is:

1. An edge tool having a cutting edge made of a nonmetal inorganic solid-state material with a facet formed on a ridge of the cutting edge,
   wherein a pre-wearing layer having a thickness of 5 nm or more and having a surface structure formed by a network of recesses and protuberances surrounded by said recesses is formed on a surface of said facet,
   an average width of said protuberances is 5 nm to 50 nm, and
   a property value of said pre-wearing layer is different from the property value of said inorganic solid-state material underlying said pre-wearing layer, and there is no solid-solid interface between said pre-wearing layer and said inorganic solid-state material.

2. An edge tool having a cutting edge made of a nonmetal inorganic solid-state material with a facet formed on a ridge of the cutting edge,
   wherein a pre-wearing layer having a thickness of 5 nm or more and having a surface structure formed by a network of recesses and protuberances surrounded by said recesses is formed on a surface of said facet,
   an average width of said protuberances is 5 nm to 50 nm, and
   the Young's modulus of said pre-wearing layer is smaller than the Young's modulus of said inorganic solid-state material underlying said pre-wearing layer, and there is no solid-solid interface between said pre-wearing layer and said inorganic solid-state material.

3. An edge tool having a cutting edge made of a nonmetal inorganic solid-state material with a facet formed on a ridge of the cutting edge,
   wherein a pre-wearing layer having a thickness of 5 nm or more and having a surface structure formed by a network of recesses and protuberances surrounded by said recesses is formed on a surface of said facet,
   an average width of said protuberances is 5 nm to 50 nm, and
   the density of said pre-wearing layer is lower than the density of said inorganic solid-state material underlying said pre-wearing layer, and there is no solid-solid interface between said pre-wearing layer and said inorganic solid-state material.

4. An edge tool having a cutting edge made of a nonmetal inorganic solid-state material with a facet formed on a ridge of the cutting edge,
   wherein a pre-wearing layer having a thickness of 5 nm or more and having a surface structure formed by a network of recesses and protuberances surrounded by said recesses is formed on a surface of said facet,
   an average width of said protuberances is 5 nm to 50 nm, and
   the hardness of said pre-wearing layer is lower than the hardness of said inorganic solid-state material underlying said pre-wearing layer, and there is no solid-solid interface between said pre-wearing layer and said inorganic solid-state material.

5. An edge tool having a cutting edge made of a nonmetal inorganic solid-state material with a facet formed on a ridge of the cutting edge,
   wherein a pre-wearing layer having a thickness of 5 nm or more and having a surface structure formed by a network of recesses and protuberances surrounded by said recesses is formed on a surface of said facet,
   an average width of said protuberances is 5 nm to 50 nm, and
   said pre-wearing layer has an amorphous structure, said inorganic solid-state material underlying said pre-wearing layer has a crystalline structure, and a boundary region between said inorganic solid-state material and said pre-wearing layer has a structure that gradually changes from the crystalline structure to the amorphous structure as it goes from said inorganic solid-state material to said pre-wearing layer.

6. An edge tool having a cutting edge made of a nonmetal inorganic solid-state material with a facet formed on a ridge of the cutting edge,
   wherein a pre-wearing layer is formed on a surface of said facet, the pre-wearing layer having a thickness of 5 nm or more, being more susceptible to wear than said inorganic solid-state material and allowing a part of said ridge of the cutting edge in which stress is concentrated during use of said ridge of the cutting edge to quickly wear so as to optimize the shape of said facet, and a property value of said pre-wearing layer is different from the property value of said inorganic solid-state material underlying said pre-wearing layer, and there is no solid-solid interface between said pre-wearing layer and said inorganic solid-state material.

7. The edge tool according to claim 1, wherein said pre-wearing layer is formed by irradiation with a gas cluster ion beam.

8. The edge tool according to claim 2, wherein said pre-wearing layer is formed by irradiation with a gas cluster ion beam.

9. The edge tool according to claim 3, wherein said pre-wearing layer is formed by irradiation with a gas cluster ion beam.

10. The edge tool according to claim 4, wherein said pre-wearing layer is formed by irradiation with a gas cluster ion beam.

11. The edge tool according to claim 5, wherein said pre-wearing layer is formed by irradiation with a gas cluster ion beam.

12. The edge tool according to claim 6, wherein said pre-wearing layer is formed by irradiation with a gas cluster ion beam.

\* \* \* \* \*